United States Patent
Mouzakitis et al.

(10) Patent No.: US 9,658,134 B2
(45) Date of Patent: May 23, 2017

(54) VEHICLE TEST APPARATUS AND METHOD

(71) Applicant: Jaguar Land Rover Limited, Coventry (GB)

(72) Inventors: Alexandros Mouzakitis, Coventry (GB); Ian Smith, Coventry (GB)

(73) Assignee: Jaguar Land Rover Limited (GB)

( * ) Notice: Subject to any disclaimer, the term of this patent is extended or adjusted under 35 U.S.C. 154(b) by 3 days.

(21) Appl. No.: 14/371,949

(22) PCT Filed: Jan. 11, 2013

(86) PCT No.: PCT/EP2013/050499
§ 371 (c)(1),
(2) Date: Jul. 11, 2014

(87) PCT Pub. No.: WO2013/104762
PCT Pub. Date: Jul. 18, 2013

(65) Prior Publication Data
US 2014/0350774 A1     Nov. 27, 2014

(30) Foreign Application Priority Data
Jan. 12, 2012   (GB) .................................. 1200493.3

(51) Int. Cl.
*G01M 17/007* (2006.01)
*G01R 31/00* (2006.01)
*G01R 31/327* (2006.01)

(52) U.S. Cl.
CPC ......... *G01M 17/007* (2013.01); *G01R 31/007* (2013.01); *G01R 31/3277* (2013.01)

(58) Field of Classification Search
CPC ............... G01M 17/00; G01M 17/007; G01R 31/005–31/007; G01R 31/3277; G05B 2219/40041
See application file for complete search history.

(56) References Cited

U.S. PATENT DOCUMENTS 4,617,510 A     10/1986   Deicke et al.
6,226,574 B1 *   5/2001   Hiramatsu ........... G01R 31/007
                                                    307/10.1
(Continued)

FOREIGN PATENT DOCUMENTS

DE     41 30 978 A1    4/1993
EP     0 716 311 A2    6/1996
(Continued)

OTHER PUBLICATIONS

Combined Search and Examination Report, Application No. GB1300494.0, Jun. 3, 2013, 5 pages.
(Continued)

*Primary Examiner* — Spencer Patton
(74) *Attorney, Agent, or Firm* — Myers Bigel, P.A.

(57) ABSTRACT

Embodiments of the present invention provide apparatus comprising: at least one motor vehicle switchpack (121-135), the switchpack comprising input means operable to control the switchpack to provide a switchpack control output to a motor vehicle control system; and motor vehicle test apparatus (100T), the test apparatus comprising: a test apparatus control system comprising computing means (115); test apparatus switching means operable under the control of the test apparatus control system to control the at least one switchpack to provide the switchpack control output to the vehicle control system, the test apparatus control system being operable to monitor a response by the vehicle control system to the switchpack control output.

14 Claims, 5 Drawing Sheets

(56) References Cited

U.S. PATENT DOCUMENTS

| | | | | |
|---|---|---|---|---|
| 6,629,029 B1* | 9/2003 | Giles | ................... | G01M 17/007 |
| | | | | 701/31.4 |
| 6,690,174 B2 | 2/2004 | Sigwart et al. | | |
| 2002/0088271 A1* | 7/2002 | Sigwart | ............... | G01M 99/002 |
| | | | | 73/114.61 |
| 2003/0020620 A1* | 1/2003 | Owen | ................. | G01R 31/005 |
| | | | | 340/635 |
| 2010/0250194 A1 | 9/2010 | Newhouse et al. | | |
| 2011/0054823 A1* | 3/2011 | Long | ................. | G05B 23/0256 |
| | | | | 702/108 |
| 2011/0175699 A1* | 7/2011 | Huss | ..................... | H01H 85/32 |
| | | | | 337/143 |
| 2012/0146956 A1* | 6/2012 | Jenkinson | ............. | G06F 3/0418 |
| | | | | 345/178 |

FOREIGN PATENT DOCUMENTS

| | | |
|---|---|---|
| EP | 1 037 061 A2 | 9/2000 |
| EP | 1 215 553 A2 | 6/2002 |
| GB | 2 102 968 A | 2/1983 |
| GB | 2 418 032 A | 3/2006 |
| JP | 2000-234985 A | 8/2000 |
| JP | 2007-147555 | 6/2007 |

OTHER PUBLICATIONS

Notice of Reason(s) for Rejection, Japanese Patent Application No. 2014-551628, Jan. 5, 2016, 7 pages.

* cited by examiner

VEHICLE TEST APPARATUS AND METHOD

RELATED APPLICATIONS

This application is a 35 U.S.C. §371 national stage application of PCT Application No. PCT/EP2013/050499, filed on Jan. 11, 2013, which claims priority from Great Britain Patent Application No. 1200493.3, filed Jan. 12, 2012, the contents of which are incorporated herein by reference in their entireties. The above-referenced PCT International Application was published in the English language as International Publication No. WO 2013/104762 A1 on Jul. 18, 2013.

FIELD OF THE INVENTION

The present invention relates to monitoring of motor vehicle electrical systems and to a method of monitoring vehicle electrical systems. Aspects of the invention relate to a vehicle, to an apparatus, to a kit of parts and to a method.

BACKGROUND

Motor vehicles typically comprise a number of electrical systems configured to implement critical and non-critical vehicle functions. Electrical systems include the powertrain system (controlled by a powertrain control module, PCM), safety system (controlled by a safety system control module, SCM) and body electrical system (controlled by a body control module, BCM). The modules may communicate with one another by means of a common area network, for example a Controller Area Network (CAN) bus or the like.

Due to package constraints and to aid installation wires associated with vehicle electrical systems may be arranged to follow common paths within a vehicle to connect different components, such as controllers, actuators, switch packs and lighting modules. A relatively large number of cables or wires may follow any given path. The cables are typically bound together forming a cable or wiring assembly or harness. The assembly may also be referred to as a cable or wiring loom. Binding of the cables together has the advantage that it reduces a flexibility of the cables. This may reduce a risk of damage to a cable and aid installation of the cables.

During vehicle development it is known to provide a test station at which a vehicle harness is constructed on a test bench. The harness is connected to actual components that will be connected to the harness in the vehicle, or to modules that simulate such components. Cables making up the harness may be of reduced length compared with actual cables to be used in the vehicle due to a reduced size of the test bench component layout.

The harness is connected to a test station controller. The controller may monitor signals transmitted by one or more cables of the harness such as a network cable carrying network signals such as CAN bus signals. The controller may also transmit CAN bus signals onto the network cable. The controller may be operable to simulate signals transmitted by any absent control modules or signals transmitted by a control module under certain conditions that cannot otherwise be reproduced at the test station, such as signals transmitted by the powertrain control module when an engine is running.

Some known controllers are operable to run software code arranged to command prescribed control operations to be performed by control modules connected to the CAN bus, and to monitor a response of the control modules by monitoring signals transmitted by the modules on the CAN bus. A portion of software code performing a given sequence of control operations may be referred to as a script.

It is an aim of embodiments of the invention to provide improved apparatus for monitoring motor vehicle electrical systems.

STATEMENT OF THE INVENTION

Embodiments of the invention may be understood by reference to the appended claims.

Aspects of the invention provide a motor vehicle, a kit of parts and a method as claimed in the appended claims.

In one aspect of the invention for which protection is sought there is provided apparatus comprising: at least one motor vehicle switchpack, the switchpack comprising input means operable to control the switchpack to provide a switchpack control output to a motor vehicle control system; and motor vehicle test apparatus, the test apparatus comprising: a test apparatus control system comprising computing means; test apparatus switching means operable under the control of the test apparatus control system to control the at least one switchpack to provide the switchpack control output to the vehicle control system, the test apparatus control system being operable to monitor a response by the vehicle control system to the switchpack control output.

The switchpack input means may be operable by a user to control the switchpack to provide the control output to the motor vehicle control system. For example, the switchpack may form part of a vehicle centre console, or be mounted to a door of the vehicle, and be accessible to a driver for manual operation of one or more switches thereof. In some embodiments the switchpack may be arranged to be actuated by a user when a user opens or closes a closure member or closure panel of the vehicle, such as a door, a boot lid, a bonnet, a fuel filler cap access door or any other suitable closure member or closure panel.

Advantageously the test apparatus control system may be operable to perform at least one action in dependence on the response of the vehicle control system to the switchpack control output.

The test apparatus computing means may be operable to run computer program code, the test apparatus control system being operable to control the test apparatus switching means to control the at least one switchpack to provide the control output under the control of the computer program code.

Optionally the test apparatus switching means comprises a test apparatus switch device and the switchpack comprises a switch device, the switchpack input means being operable to operate the switch device of the switchpack, the test apparatus switch device being operable by the test apparatus control system to control the switchpack to provide substantially the same output as the switch pack provides when the switchpack input means is operated.

Optionally the test apparatus switch device is connected electrically in parallel with the switchpack switch device.

The switchpack switch device may be operable to make or break an electrical connection between a first set of terminals of the switchpack, the test apparatus switch device also being operable by the test apparatus control system to make or break the electrical connection between the first set of terminals of the switchpack in a corresponding manner.

The switchpack switch device may comprise mechanically actuable switch means.

The test apparatus switching means may comprises one selected from amongst mechanical switch means and electronic switch means. The electronic switch means may for example comprise a solid state electronic device such as a transistor, optionally a field effect transistor (FET).

Optionally the test apparatus switching means comprises a mechanical actuator for actuating the switchpack input means.

The switchpack may comprise a touch-sensitive display means.

The switchpack may comprise a remote control device such as a keyfob device.

The test apparatus control system may be operable to read signals transmitted on a motor vehicle controller area network.

This feature may for example facilitate monitoring by the test apparatus of a response of the control system to a switchpack control output.

In addition or instead the test apparatus control system may be operable to transmit signals on a motor vehicle controller area network.

The apparatus may comprise a test apparatus removable overload protection element connectable to electrical connector means of a vehicle electrical circuit overload protection apparatus, the test apparatus removable overload protection element comprising means for detecting a flow of electrical current therethrough and means for outputting a signal to the test apparatus control system corresponding to an amount of electrical current flow therethrough.

Optionally the test apparatus removable overload protection element is operable to limit an amount of electrical current flowing through an electrical circuit of the motor vehicle.

Thus the removable overload protection element may be operable to act in a similar manner to a fuse or circuit breaker and limit the amount of current that flows through an electrical circuit in which the element in protected. The overload protection element may be arranged to replace a fuse or circuit breaker element of a motor vehicle such as a production vehicle, enabling a diagnostic operation to be performed to diagnose a fault or feature associated with a motor vehicle.

In a further aspect of the invention for which protection is sought there is provided a motor vehicle comprising apparatus according to a preceding aspect.

In one aspect of the invention for which protection is sought there is provided a kit of parts comprising:
  motor vehicle test apparatus, the test apparatus comprising:
    a test apparatus control system comprising computing means;
    test apparatus switching means operable under the control of the test apparatus control system to control at least one motor vehicle switchpack to provide a control output to the vehicle control system, the control output being substantially the same output provided by the switchpack when a input means of the switchpack is operated,
    the test apparatus control system being operable to monitor a response by the vehicle control system to the switchpack control output.

The kit of parts may further comprise at least one motor vehicle switchpack, the switchpack comprising input means operable to control the switchpack to provide the control output to a motor vehicle control system, optionally operable by a user.

The kit of parts may comprise current measurement means, the current measurement means being adapted to replace a removable overload protection element of a vehicle electrical circuit overload protection apparatus.

In one aspect of the invention for which protection is sought there is provided a method of monitoring operation of a motor vehicle comprising at least one switchpack, the switchpack comprising input means operable to control the switchpack to provide a control output to a vehicle control system, the method comprising:
  providing a test apparatus control system having computing means, and controlling test apparatus switching means by means of the test apparatus control system to control the at least one switchpack to provide the control output to the vehicle control system; and
  monitoring by means of the test apparatus a response by the vehicle control system to the switchpack control output.

The method may comprise providing switchpack input means operable by a user to control the switchpack to provide substantially the same control output to the vehicle control system.

In one aspect of the invention there is provided test apparatus for a motor vehicle, the test apparatus comprising: at least one device operable to modify an electrical property of a vehicle electrical circuit thereby to provide a control input to the vehicle; control apparatus operable to control the at least one device to provide the control input to the vehicle; and monitoring apparatus operable to monitor at least one parameter associated with the vehicle responsive to the control input and to provide an output responsive to the value of the parameter.

According to another aspect of the invention there is provided a test apparatus for a motor vehicle having at least one user-actuable switch element connected in an electrical circuit and operable to make or break the electrical circuit to provide a switch control input to the vehicle, the apparatus comprising:
  secondary switch means operable to make or break the electrical circuit under the control of switch control means thereby to provide said switch control input to the vehicle independently of user actuation of the user-actuable switch element; and
  monitor means operable to monitor at least one parameter associated with the vehicle responsive to the user-actuable switch control input.

The apparatus may be operable to provide an output responsive to the value of the parameter.

Embodiments of the invention have the advantage that a production motor vehicle may be subject to automated testing by means of test apparatus adapted wherein vehicle electrical circuits substantially as installed in a production motor vehicle may be tested. A requirement to modify a cable harness of the vehicle or to change an environment in which the harness operates is therefore substantially eliminated. Thus a harness need not be placed on a bench top for testing, rather it can remain in a production vehicle substantially as installed. This increases substantially a likelihood that any vehicle control features associated with vehicle operation that are not well understood prior to testing may be reproduced under the control of the control means and the origin of the features determined.

Embodiments of the invention have the advantage that control inputs may be provided to the vehicle by actuating actual electrical circuits associated with a switch element rather than simulating actuation of a switch element, for example by injecting a signal onto a communications network associated with a vehicle. Thus if a feature of vehicle operation that is not well understood has arisen due to an unexpected effect caused by a circuit associated with a switch element, the effect may be more reliably reproduced.

A response of the vehicle to a control input may be monitored for example by monitoring signals on a CAN bus without a requirement to install in-line current or voltage measurement devices in cables of the harness.

Advantageously, the motor vehicle may be operable to receive a control signal from a test apparatus computing means, responsive to which the switch control means is operable to actuate the secondary switch means.

Conveniently, the motor vehicle may be operable to transmit the output of the monitor means to the test apparatus computing means.

In another aspect of the invention for which protection is sought there is provided a motor vehicle according to the first aspect of the invention in combination with said test apparatus computing means.

The test apparatus computing means may be operable to run computer program code and to control the switch control means to actuate the secondary switch means under the control of the computer program code.

Optionally, the test apparatus and/or the test apparatus computing means are configurable to run substantially the same computer software code as used on conventional vehicle test stations and vehicle test station controllers typically employed during vehicle development. This affords the advantage that existing computer software code and scripts are reusable in the presently proposed test apparatus and obviates re-writing computer software code and software test scripts.

Alternatively, or in addition, the test apparatus and/or the test apparatus computing means are operable to use substantially the same front-end tool-set and user interface as currently employed in conventional vehicle test stations and vehicle test station controllers. This provides consistency and familiarity for users accustomed to operating conventional vehicle test stations.

The test apparatus computing means may be located remote from the motor vehicle, the test apparatus computing means being operable to communicate with the motor vehicle by remote communications means.

The remote communications means may for example be wireless communications means such as cellular communications means. Alternatively the remote communications means may be a wired communications means.

Advantageously, the secondary switch means may be coupled in parallel with the user-actuable switch element, the secondary switch means being operable by the control means to make or break the electrical circuit instead of the user-actuable switch element.

Parallel connection is particularly preferred in the case of a push-to-make type mechanical switch. Other arrangements are also useful.

Alternatively, the secondary switch means is coupled in series with the user-actuable switch element, the secondary switch means being operable by the control means to make or break the electrical circuit instead of the user-actuable switch element.

Series connection is particularly preferred in the case of a push-to-break type mechanical switch. Other arrangements are also useful.

Conveniently, the secondary switch means comprises one selected from amongst mechanical switch means and electronic switch means.

Where the secondary switch means comprises mechanical switch means, said mechanical switch means may for example comprise a relay or contactor arrangement.

Where the secondary switch means comprises electronic switch means, said electronic switch means may for example comprise a transistor arrangement, optionally an integrated circuit transistor arrangement. The switch means may comprise optically isolated switch means whereby the control means is isolated optically from the electrical circuit.

The secondary switch means may optionally comprise a mechanical actuator for actuating the user-actuable switch element. Thus the mechanical actuator may be arranged mechanically to actuate the user-actuable switch element. The mechanical actuator may for example be a 'robotic finger'.

Without limitation, the user-actuable switch means may comprise a mechanical switch, a touch-sensitive display means, or a remote control device such as a key fob device.

Advantageously, the motor vehicle may comprise an electrical circuit overload protection apparatus comprising electrical connector means having a plurality of electrical terminals arranged to connect to a corresponding plurality of terminals of a removable overload protection element, the test apparatus comprising a test apparatus removable overload protection element connectable to the electrical connector means of the electrical circuit overload protection apparatus, the test apparatus removable overload protection element being operable to limit an amount of electrical current flowing through an electrical circuit of the motor vehicle, the test apparatus removable overload protection element comprising means for detecting a flow of electrical current therethrough and means for outputting a signal responsive to an amount of a flow of electrical current therethrough.

The electrical circuit overload protection apparatus of the motor vehicle may for example be a fusebox or a circuit breaker box.

The monitor means may comprise the test apparatus removable overload protection element.

Conveniently, the motor vehicle may further comprise a controller area network operable to allow a plurality of vehicle system controllers to communicate with one another. In this instance, the monitor means may be operable to read signals transmitted by the controller area network.

Advantageously, the motor vehicle may further comprise means for transmitting a signal on a controller area network of the motor vehicle.

In another aspect of the invention for which protection is sought there is provided a kit of parts comprising vehicle test apparatus, the test apparatus comprising:

secondary switch means connectable in a switchpack of a vehicle and operable to make or break an electrical circuit of a switchpack under the control of switch control means of the apparatus independently of user actuation of a user-actuable switch element of a switchpack thereby to provide a switch control input to a vehicle; and monitor means operable to monitor a value of at least one parameter associated with a vehicle responsive to a switch control input and to provide an output responsive to a value of a parameter.

The kit of parts may further comprise current measurement means, the current measurement means being adapted to provide a removable overload protection element of a vehicle electrical circuit overload protection apparatus.

Thus the removable protection element may be inserted in an electrical circuit overload protection apparatus (such as a fusebox or circuit breaker box) in order to measure current passing through a circuit of a vehicle.

In another aspect of the invention for which protection is sought there is provided a method of monitoring operation of a motor vehicle having at least one user-actuable switch element connected in an electrical circuit and operable to make or break the electrical circuit to provide a switch control input to the motor vehicle, the method comprising:

controlling secondary switch means of the motor vehicle to make or break the electrical circuit under the control of switch control means independently of user actuation of the user-actuable switch element thereby to provide said switch control input to the motor vehicle independently of user actuation of the user-actuable switch element;

monitoring a value of at least one parameter associated with the motor vehicle responsive to the user-actuable switch control input; and providing an output responsive to the value of the at least one parameter.

In one embodiment of the invention there is provided a motor vehicle 100 comprising at least one user-actuable switch element 121-135 connected in an electrical circuit and operable to make or break the electrical circuit to provide a switch control input to the vehicle 100, the vehicle 100 comprising test apparatus comprising: secondary switch means operable to make or break the electrical circuit under the control of switch control means 110 thereby to provide said switch control input to the vehicle 100 independently of user actuation of the user-actuable switch element 121-135; and monitor means operable to monitor at least one parameter associated with the vehicle 100 responsive to the user-actuable switch control input and to provide an output responsive to the value of the parameter.

Within the scope of this application it is expressly intended that the various aspects, embodiments, examples and alternatives set out in the preceding paragraphs, in the claims and/or in the following description and drawings, and in particular the individual features thereof, may be taken independently or in any combination. Features described in connection with one embodiment are applicable to all embodiments, unless such features are incompatible.

BRIEF DESCRIPTION OF THE DRAWINGS

Embodiments of the invention will now be described, by way of example only, with reference to the accompanying figures in which.

DETAILED DESCRIPTION

Figure 1:
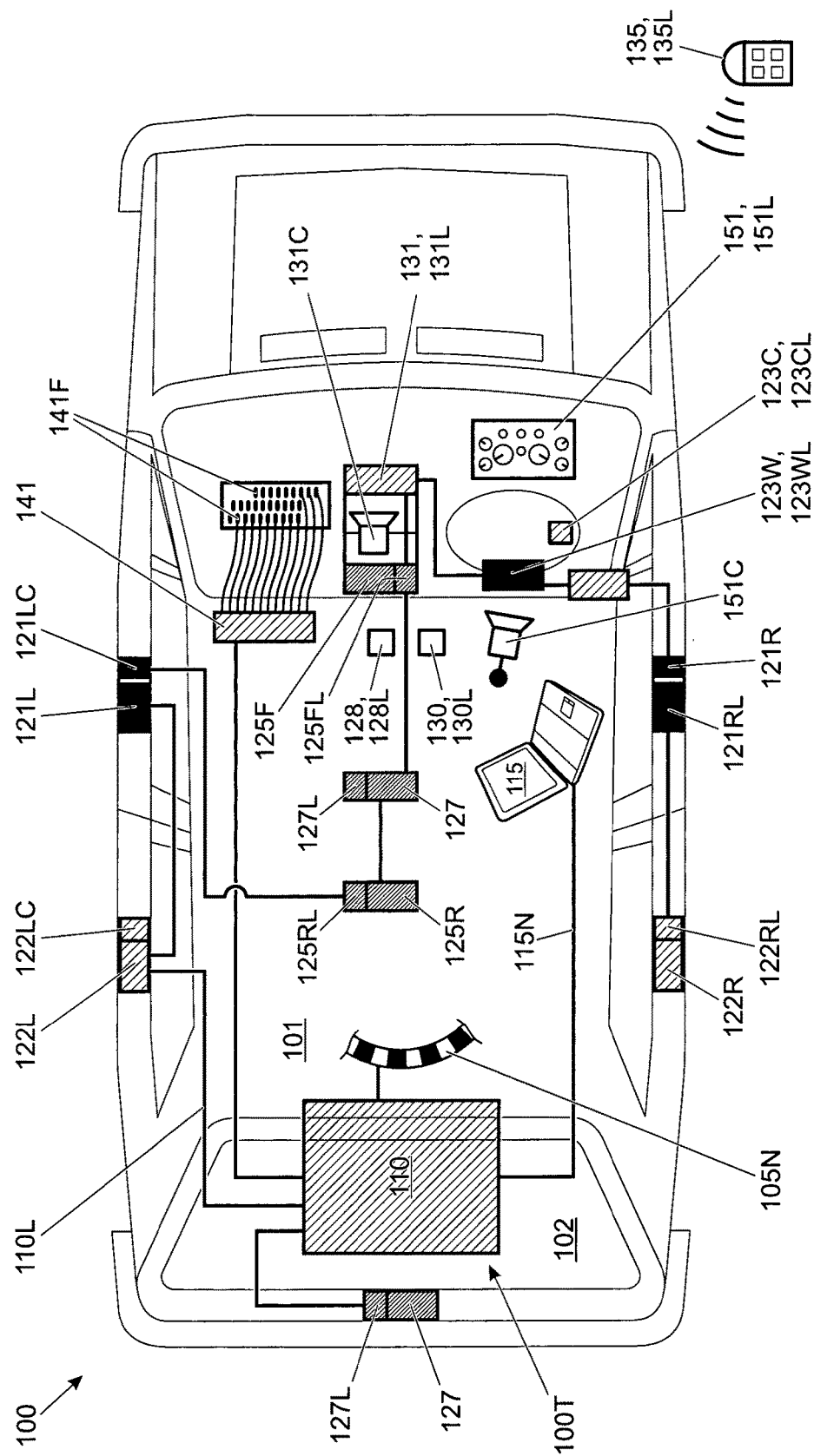
FIG. 1 is a schematic illustration of a physical layout of a vehicle according to an embodiment of the present invention.

FIG. 1 is a schematic illustration of a vehicle 100 according to an embodiment of the present invention. The vehicle 100 has a cabin environment 101 and a boot environment 102 rearward of the cabin environment. In the embodiment shown the cabin and boot environments 101, 102 are not separate compartments although in some embodiments they may be, being separated by a dividing wall or other structure.

In the embodiment shown the cabin environment 101 includes a number of user-actuable switches comprised in switch packs. The switch packs include left and right front door-mounted switch packs 121L, 121R, left and right rear door-mounted switch packs 122L, 122R, steering switchpacks including steering wheel-mounted joystick switchpacks 123W and steering column switchpacks 123C, front and rear climate control switchpacks 125F, 125R, seat switchpacks 127, an interior light switchpack 128, a start/stop button switchpack 130 and a high level display (HLD) in the form of a touchscreen switchpack 131. The vehicle 100 also has a remote control fob switchpack 135.

The switch packs 121-135 each have one or more user-actuable switches. It is to be understood that some of the switches may be mechanical whilst some may be electronic, such as those comprised by the touchscreen switchpack 131.

The vehicle 100 is equipped with a test apparatus 100T. The test apparatus 100T has a control module 110, a portable computing device 115 in the form of a laptop computing device 115 and electronic secondary switches. The electronic secondary switches are provided in switchpacks 121-135 of the vehicle 100 and are coupled in parallel with the user-actuable switches of each switchpack 121-135. The electronic secondary switches may be opened and closed under the control of the test apparatus control module 110.

In addition to switches directly actuated by a user, other switches may be controlled by a user, such as door ajar contact switches which may be located between a vehicle closure such as a door or hood/bonnet and the vehicle body (not shown in FIG. 1 for clarity). Such switches may be controlled by the test apparatus 100T so as to simulate a door open or door closed scenario. Other contact switches may also be controlled, such as those controlling the operation of door latches, sunroof or side windows (for example for anti-trap purposes). Each of these switches may also have an electronic secondary switch of the test apparatus 100T coupled in parallel therewith. The secondary switches are operable under the control of the test apparatus control module 110 as noted above.

Each of the secondary switches 121-135 has a local electronic switch controller 121LL, 121RL, 122LL, 122RL, 123WL, 123CL, 125FL, 125RL, 127L, 128L, 130L, 131L, 135L associated with it that is arranged to receive a signal from the control module 110 when it is required to actuate the corresponding secondary switch. The control module 110 is arranged to communicate with each local switch controller by means of a local communications bus (LCB) 110L. In the present embodiment, each switch pack 121-135 is provided with a single switch controller arranged to control the one or more secondary switches associated with that switch pack 121-135. The LCB 110L is in the form of a network cable that connects the local controllers of each switch pack 121-135 to one another whereby control signals from the controller 110 may be distributed to the local switch controllers.

Each local switch controller has a unique identification code allowing the controller 110 to control each local switch controller individually via the common LCB 110L. Alternatively, the control module 110 may be arranged to communicate with each local switch controller by means of a respective dedicated hard-wired electrical connection.

In the case of the touchscreen switchpack 131, the touch screen local electronic switch controller 131L is operable to control the switchpack 131 to provide an output corresponding to that which would be provided if a user actuated the touch screen directly. The controller 131L may be arranged to apply an output signal to one or more output terminals of the switchpack 131 in response to a command from the control module 110. For example, if the control module 110 commands actuation of a button displayed in a particular area of a screen of the touchscreen switchpack 131, the local electronic switch controller 131L may itself generate an output signal at one or more output terminals of the switchpack 131 reproducing (or simulating) the signal that would be generated by the switchpack 131 if a user where to touch the corresponding area of the screen.

In some embodiments this output signal may be in the form of a controller area network (CAN) bus 105N signal, described in more detail below.

It is to be understood that embodiments of the present invention allow the test apparatus 100T to simulate user actuation of the touchscreen switchpack 131 whilst at the same time allowing a user to operate the switchpack 131. Other arrangements are also useful.

Two camera modules are provided. A first camera module 151C is arranged to capture an image of an instrument cluster 151 whilst a second camera module 131C is arranged to capture an image of the HLD 131. The images captured by the first and second camera modules 151C, 131C are relayed to the central control module 110.

The vehicle 100 is also provided with a power measurement and communications module PMC 141. The PMC 141 is configured to measure an amount of current flowing through each of a plurality of circuit breaker or fuse elements 141F of the vehicle, being elements arranged to generate an open circuit condition in a circuit in which they are connected when an amount of current flowing therethrough exceeds a prescribed value. The PMC 141 measures the amount of current flowing through each fuse element 141F and outputs the values to the control module 110. It is to be understood that this allows an electrical state of the vehicle 100 to be monitored as a function of time.

Figure 2:
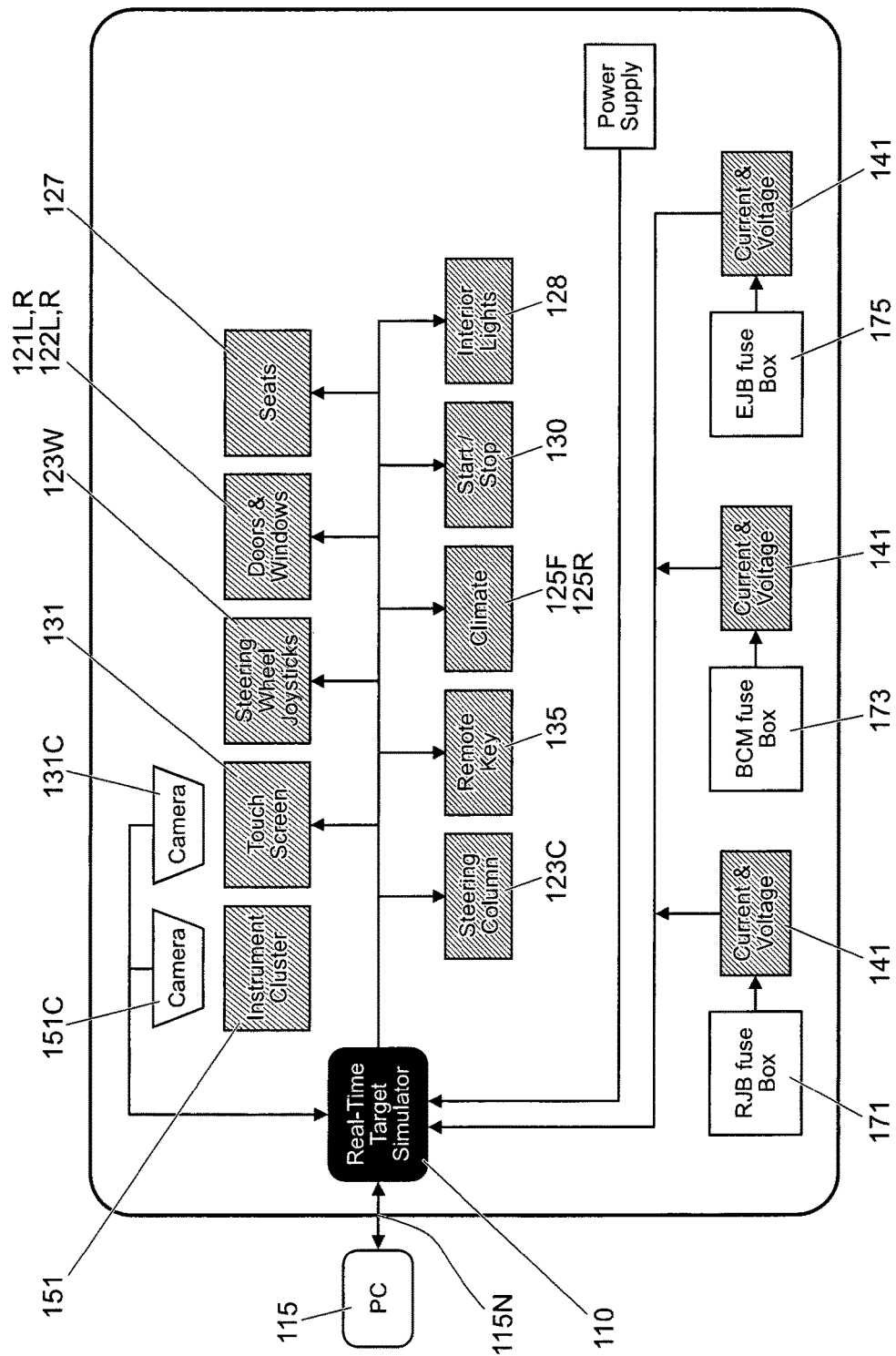
FIG. 2 is a system level schematic illustration of a vehicle according to an embodiment of the present invention.

FIG. 2 is a corresponding system-level diagram to the vehicle layout diagram of FIG. 1 showing a connectivity of switchpacks 121-135 and the PMC 141. In the embodiment of FIG. 1 the vehicle 100 has three fuse boxes that are monitored as shown in FIG. 2: an RJB (rear junction box) fusebox 171, a BCM (body control module) fusebox 173 and an EJB (engine junction box) fusebox 175. The PMC 141 is configured to measure currents in the fuses of each of these fuse boxes, i.e. the RJB fusebox 171, BCM fusebox 173, and EJB fusebox 175.

In order to measure current flow through the fuse elements, each fuse element comprises a current-measuring device that is connected in series with a fusible link. The fusible links are arranged to assume an open circuit condition when an amount of current flow therethrough exceeds the prescribed value. In some embodiments the fusible links may be replaced by a circuit breaker arrangement in which a current measuring device triggers a mechanical switch to assume an open condition when the current exceeds the prescribed value, rather than fusing a fusible link. The circuit breaker arrangement may be configured to permit re-setting of the mechanical switch after the switch has assumed the open condition. The current measuring devices are each arranged to output to the PMC 141 a value corresponding to the amount of current flowing through each fuse element. In the present embodiment the devices output the amount of current flowing through each fuse element substantially continuously.

A computing device 115 is connected to the control module 110 to allow user control and interrogation of the module 110. In the embodiment shown the computing device 115 is in the form of a laptop computer 115 connected to the module 110 by means of a network cable 115N. In some embodiments the computing device 115 is arranged to communicate with the control module 110 by means of a wireless link, for example a cellular network wireless link, short range radio link such as Bluetooth® or any other suitable link.

The computing device 115 is operable to execute computer software code that commands the control module 110 to open or close each of the electronic switches associated with the switchpacks 121-135.

The central control module 110 is coupled to a vehicle controller area network (CAN) bus 105N and is configured to transmit and receive CAN bus signals or 'messages'. The CAN bus 105N connects controllers associated with the vehicle 100 to one another allowing the controllers to communicate with one another. The CAN bus 105N is used to transmit a number of signals associated with vehicle operation including a current value of vehicle power mode and data in respect of a state of one or more controllers, accessories and systems of the vehicle 100. Vehicle controllers may communicate with one another via the CAN bus 105N.

It is to be understood that the computing means 115 is operable to instruct the control module 110 to actuate one or more of the electronic switches associated with the switchpacks 121-135 and to monitor a response of the vehicle 100 to actuation of the one or more switches by listening for one or more signals transmitted on the CAN bus 105N responsive to switch actuation.

Optionally, the computing means 115 and/or the central control module 110 are arranged to run substantially the same computer software code as used on conventional vehicle test stations and/or vehicle test station controllers typically employed during vehicle development such as bench-top test stations. This affords the advantage that existing computer software code and scripts are reusable in the presently proposed test apparatus and obviates re-writing computer software code and software test scripts.

Alternatively, or in addition, the computing means 115 and/or the central control module 110 may be configured to use substantially the same front-end tool-set and user interface as currently employed in conventional vehicle test stations and vehicle test station controllers. This provides consistency and familiarity for users accustomed to operating conventional bench-top vehicle hardware test stations.

It is to be understood that the control module 110 may also be controlled to transmit one or more CAN bus signals on the CAN bus 105N to simulate a vehicle state or action that cannot be provided by a corresponding controller, accessory or system. For example, if the vehicle 100 is parked with an engine of the vehicle 100 switched off and it is required to simulate conditions when the vehicle is being driven, the control module 110 may be arranged to transmit on the CAN bus 105N one or more signals corresponding to a driving state of the vehicle 100, such as a corresponding power mode. Thus it is to be understood that a response of one or more vehicle controllers or systems to actuation of one or more of the electronic switches whilst the vehicle is being driven may be determined without a requirement actually to drive the vehicle 100. This has the advantage that vehicle testing may be performed without a requirement for personnel to be physically present to drive the vehicle 100. Furthermore, fuel savings may be made by eliminating the requirement to physically drive the vehicle 100.

In one method of operation, the computing device 115 is programmed to execute a script of computer program code in which actuation of a series of user-operated switches of one or more switchpacks 121-135 is simulated. The control module 110 is instructed by the computing device 115 to actuate one or more electronic switches associated with the switchpacks 121-135 thereby to simulate operation of the vehicle 100. The control module 110 commands the local switch controller associated with the corresponding switchpack 121-135 to actuate the required electronic switch. The control module 110 monitors transmission of CAN bus signals on the CAN bus 105N and relays to the computing device 115 data in respect of the signals transmitted. The data may be logged by the computing device 115 and/or displayed in real time by the device 115 on a screen thereof.

The device 115 may also be operable to display an image captured by one or both of the cameras 151C, 131C. This feature permits an operator to inspect the instrument panel 151 and HLD 131 respectively to check what is actually being displayed by the instrument panel 151 and HLD 131 in the vehicle 100 at any given moment in time. In addition, the device 115 may be configured to communicate with and command selections from the instrument panel 151 and HLD 131 via the control module 110.

In some embodiments one or more further cameras may be provided for relaying to a user an image of one or more other portions of the vehicle 100. Thus for example a camera may be arranged to capture an image of one or more internal or external lighting units to allow verification whether a light is on or off, an image of one or more doors or windows to allow verification of a open/closed state thereof, and any other suitable portion of an interior or exterior of a vehicle 100.

Figure 3:
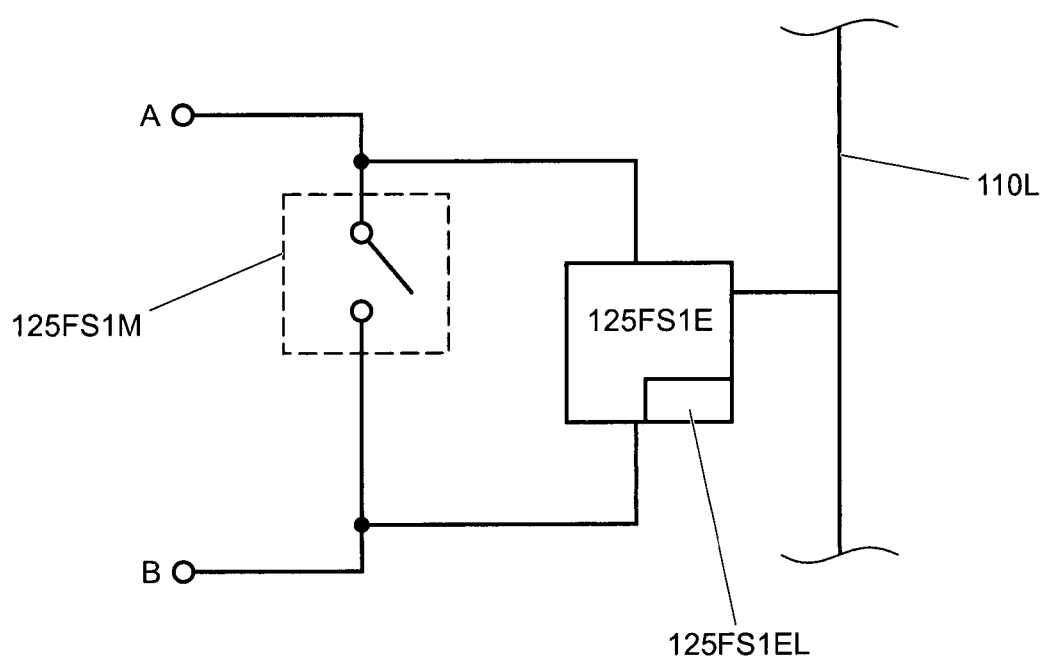
FIG. 3 is a schematic circuit diagram of a portion of a switchpack according to an embodiment of the present invention.

FIG. 3 is a schematic circuit diagram showing a configuration of a switch of the front climate control switchpack 125F, by way of example. The switch shown has a mechanical user-actuable switch element 125FS1M. In parallel with the mechanical switch element 125FS1M is an electronic switch element 125FS1E. It is to be understood that because the electronic switch element 125FS1E is connected in parallel with the mechanical switch element 125FS1M, closing or opening the electronic switch element 125FS1E has substantially the same effect, as between terminals A and B, as closing or opening the mechanical switch element 125FS1M.

The electronic switch element 125FS1E has a local controller 125FS1EL coupled to the LCB 110L. When the controller 125FS1EL determines that the control module 110 is required to simulate opening or closing of the mechanical switch element 125FS1M the controller 125FS1EL controls the electronic switch element 125FS1E to open or close in a corresponding manner.

In some embodiments the electronic switch element 125FS1E comprises a relay in order to open or close a connection between terminals A and B. In some embodiments, in addition or instead the electronic switch element 125FS1E may comprise one or more solid state switch elements such as one or more field effect transistors, optionally one or more integrated circuits, to open or close the connection.

Figure 4:
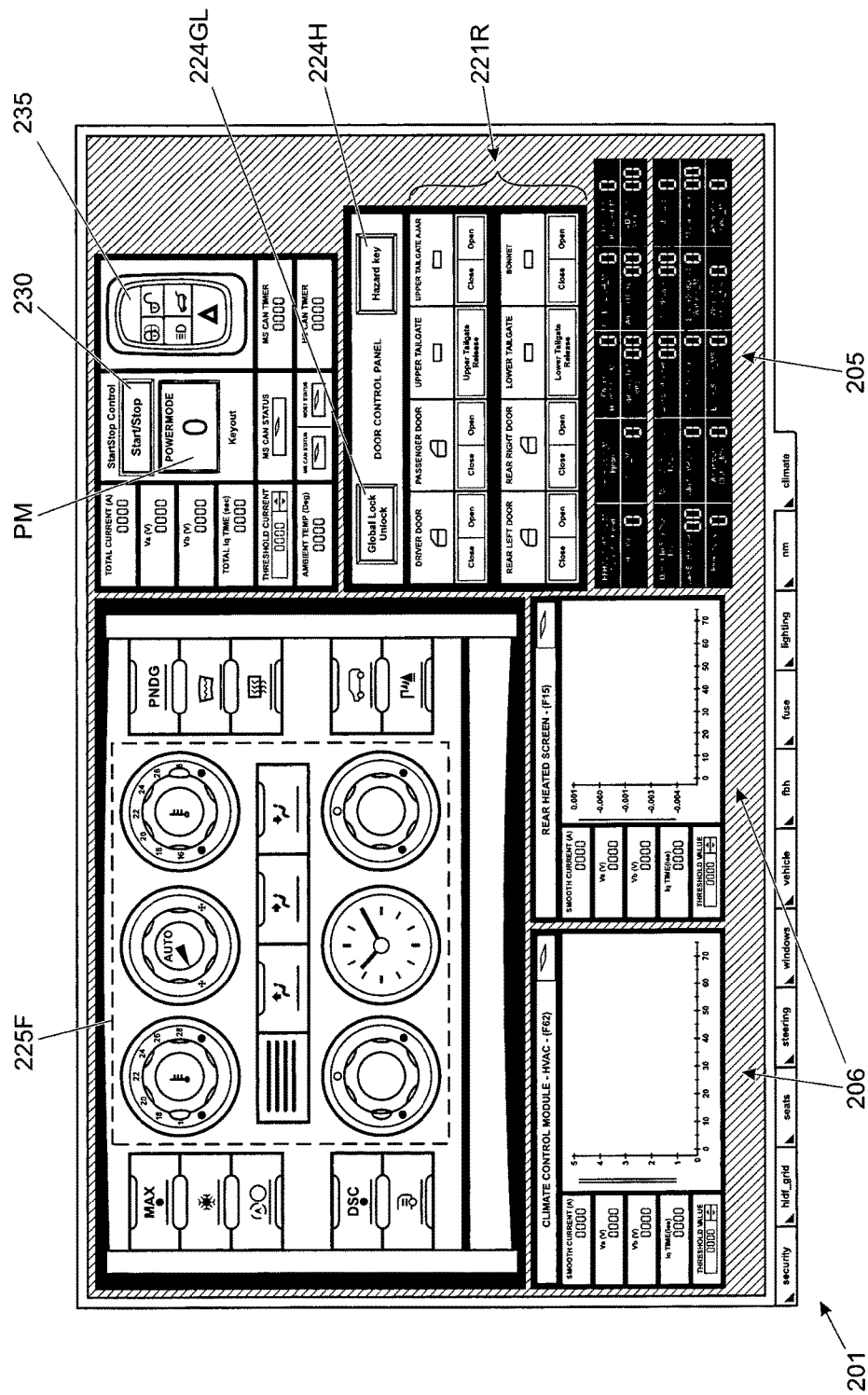
FIG. 4 is a screen shot taken from a computer running software code for actuating switch packs associated with the vehicle of FIG. 1 and displaying corresponding vehicle output data.

FIG. 4 is a screenshot of a display 201 of the computing device 115 whilst running computer software code for controlling the control module 110. The screenshot shows a software representation 225F of the front climate control switchpack 125F and a software representation 235 of the remote control fob switchpack 135. To the left of the representation 235 is a software representation 230 of the start/stop switchpack 130.

Other switchpack software representations include a hazard warning light actuation switchpack 224H, a global lock/unlock switchpack 224GL, right front door-mounted switch pack 221. Switch pack 221 allows an operator to control locking and unlocking of a driver door, passenger door, rear right door and rear left door. It also allows the operator to release an upper and lower tailgate and bonnet. Furthermore if the upper tailgate is ajar the switch pack 221 allows an operator to close or open the tailgate.

Additionally, door ajar switchpacks for each vehicle closure are also represented in FIG. 4. In the present embodiment, electronic switch elements of the test apparatus 100T are provided in parallel with door ajar switches of each door ajar switchpack, thereby enabling opening and closing of the vehicle door ajar switches to be simulated by the control module 110.

A user may actuate any of the switches associated with the switchpacks displayed on the display by clicking a mouse pointer over the graphical representation of a switch of a given switchpack. Where a switch is a simple on/off toggle switch clicking a mouse button when the mouse point hovers over the representation of a switch is arranged to toggle a state of the switch. Where the switch is a non-toggling switch, the switch may be held in an actuated state by holding a mouse button in a depressed state over the software representation of the switch and releasing the mouse button when it is desired to release the switch. Where a switch is a rotary switch, rotation of the switch may be simulated by clicking on the representation of the switch and dragging the mouse to the left or right, simulating anticlockwise and clockwise rotation of the switch, respectively. Other arrangements are also useful.

Other arrangements for actuating a switch by means of the computing device 115 are also useful.

The display of the computing device 115 also provides an indication of the value of the power mode parameter currently assumed by the vehicle 100 (shown at PM in FIG. 4). In the screenshot of FIG. 4 the power mode is shown as '0', indicating that the vehicle is in a shutdown mode. The control module 110 determines the value of power mode parameter by reference to signals transmitted on the CAN bus 105N.

To the left of the software representation 230 of the start/stop switchpack 130 is displayed an indication of total current and voltage values corresponding to a total amount of current being drawn from a primary battery of the vehicle and a potential difference across terminals of the primary battery. It is to be understood that, during testing, the primary battery may be removed from the vehicle and substituted by a suitable, voltage controllable, power supply. The values of current and voltage are determined by reference to measurements made by the PMC 141. When a power supply is used as a substitute for the primary battery, the global vehicle current is measurable independently at the power supply and may be separately reported to the control module 110. When a primary battery is used, then the vehicle current and voltage are measurable locally at the battery, and optionally measurable independently via a vehicle based battery monitoring system. In some arrangements the values of current and voltage measured locally at the battery may be referenced against the voltage and current measured by the vehicle via the battery monitoring system and the measurements made by the PMC 141.

Below the representation of the door switchpack 221, values of vehicle operating parameters (shown at 205) are displayed including engine coolant temperature, front cabin air blower level, screen defrost settings and other parameters associated with a heating, ventilation and air-conditioning (HVAC) system. The computing device 115 is also configured to plot values of one or more selected parameters measured by the control module 110 as a function of time. At 206 a user has set up two windows to display parameters as a function of time. In the configuration shown, the left-hand window is configured to plot power drawn by the HVAC system as a function of time. The right-hand window is configured to show power drawn by a rear heated screen as a function of time. Other configurations are also useful.

Embodiments of the present invention have the advantage that simulation of operation of a vehicle 100 by one or more persons may be performed and a response of a vehicle 100 to one or more control operations may be monitored. The simulation may be performed in the absence of a human operative or in the presence of a human operative.

It is to be understood that embodiments of the invention are suitable for use with a fully functional vehicle or with a partially functional vehicle. Embodiments of the invention are suitable for use with a production vehicle or a prototype vehicle. Embodiments of the invention are suitable for use in a vehicle as the vehicle is being driven. Thus it is to be understood that actuation of one or more switches of one or more switchpacks of the vehicle may be performed automatically whilst the vehicle is being driven. This feature has a number of advantages.

One advantage is that if it is required to simulate actuation of one or more switches at prescribed times, or to actuate each of a plurality of switches in a prescribed sequence, the control module 110 may perform the actuation automatically whilst a driver drives the vehicle 100. Thus the driver need not be distracted by a requirement to perform switch actuation whilst driving. In cases where actuation of switches is required that are not accessible to a driver whilst driving, the further advantage exists that it is not required to have more than one person present in the vehicle 100 in order to undertake testing.

A further advantage of some embodiments of the invention is that multiple sequences of switch actuations may be performed in a precise and reproducible manner, optionally at a higher rate than might be otherwise reliably accomplished by a human operative. This may increase a reliability of data logged by the control module 110 since a risk that a test fails correctly to follow a required sequence of actuations due to human error in actuating a switch may be substantially eliminated.

A still further advantage of embodiments of the present invention is that a response of the vehicle 100 to actuation of a switch may be undertaken in a synchronised manner. That is, when a switch is actuated, a response of the vehicle 100 to actuation of the switch may be monitored substantially at the instant the switch is actuated and immediately following actuation of the switch. This feature may reduce substantially an amount of work required to interpret data logged by the control module 110, including data logged in response to one or more switch actuations. For example it may reduce an operator workload in cross-correlating data in respect of actuation of a switch with data in respect of vehicle operations, such as signals transmitted on the CAN bus 105N. This may reduce an amount of time required to be spent by an operator in order to understand one or more features associated with a vehicle or vehicle operation.

It is to be understood that in some embodiments, in one or more switchpacks the electronically controlled switch is connected in parallel with a user-actuable mechanical switch in such a manner that a driver or other occupant of a vehicle may still actuate the user-actuable switch, e.g. whilst the vehicle is being driven, in the usual manner. In some embodiments installation of the electronically controlled switch may be performed such that the switch does not change an appearance of a switchpack as viewed by an occupant of the vehicle. That is, an 'A' surface of the switchpack visible to a user in normal vehicle use may be substantially unchanged. Accordingly, the switch may be mounted within or behind the switchpack in some embodiments.

In some embodiments, the control module 110 may be operable to actuate test apparatus switching means in the form of a device operable to actuate a user-actuable mechanical switch. For example, the device, which may be in the form of a robot 'finger', optionally a mechanically actuated lever, shaft, arm, lever, hook or other member, may be operable to actuate a control portion of a switchpack to effect actuation of a switch substantially as if a user were actuating the switch. Thus in some embodiments it may not be necessary electrically to connect an electronic or mechanical switch in a switchpack. This is because actuation of the switchpack may be performed by actuating an existing switch of the switchpack using (say) a solenoid-actuated lever, arm or the like. Other arrangements are also useful.

Figure 5:
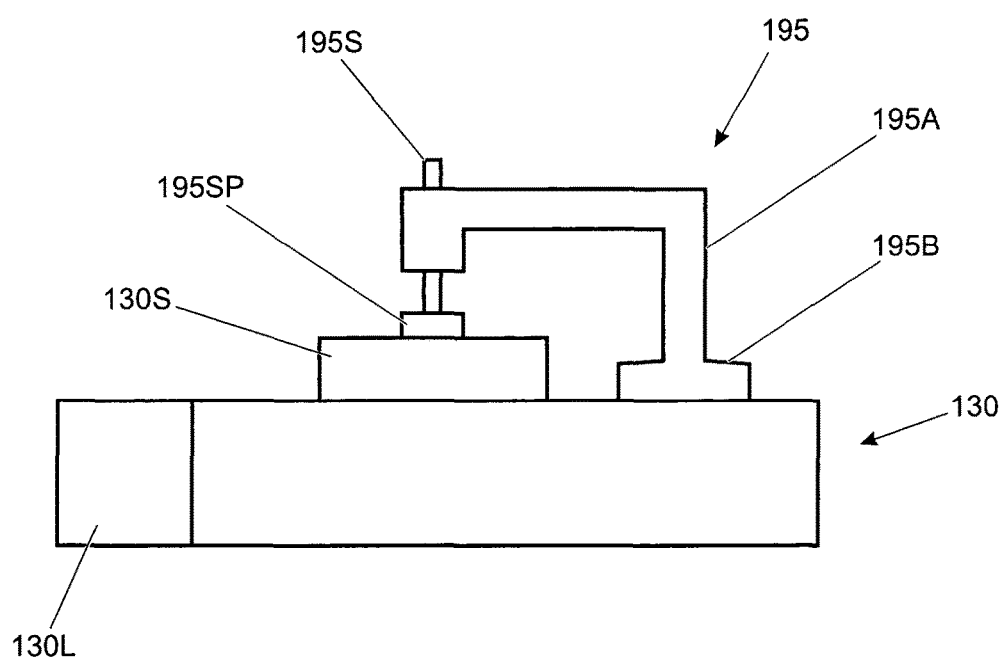
FIG. 5 shows an example of a mechanical actuation device according to an embodiment of the present invention operable to actuate a switch of a stop/start switchpack.

FIG. 5 shows an example of a mechanical actuation device 195 operable to actuate a switch 130S of a stop/start switchpack 130.

The device 195 has a base portion 195B having means for attachment of the device to a portion of a vehicle such as a portion of the switchpack 130. In the arrangement shown the base portion 195B is attached by means of a suction cup although other fixing devices are also useful such as adhesive pads, screw or bolt fixing elements and any other suitable fixing device.

The base portion 105B supports a substantially L-shaped arm 195A that in turn supports a solenoid coil (not shown) and a solenoid shaft 195S. The shaft 195S may be driven by the coil towards and away from the switch 130S so as to depress the switch 130S when required. the shaft 195S has an elastomeric pad element 195SP that is pressed against the switch 130S when it is required to actuate the switch 130S.

It is to be understood that the device 195 enables simulation of user actuation of the stop/start switchpack 130 without a requirement to connect a further switch electrically to the switchpack 130.

Embodiments of the present invention may be understood by reference to the following numbered paragraphs:

1. An apparatus comprising:
  at least one motor vehicle switchpack, the switchpack comprising an input portion operable to control the switchpack to provide a switchpack control output to a motor vehicle control system; and
  motor vehicle test apparatus, the test apparatus comprising:
    a test apparatus control system comprising a computing device;
    a test apparatus switch device operable under the control of the test apparatus control system to cause the at least one switchpack to provide the switchpack control output to the vehicle control system, the test apparatus control system being operable to monitor a response by the vehicle control system to the switchpack control output.

2. An apparatus as described in paragraph 1 wherein the test apparatus control system is operable to perform at least one action in dependence on the response of the vehicle control system to the switchpack control output.

3. An apparatus as described in paragraph 1 wherein the test apparatus computing device is operable to run computer program code, the test apparatus control system being operable to control the test apparatus switch device to cause the at least one switchpack to provide the control output under the control of the computer program code.

4. An apparatus as described in paragraph 1 wherein the switchpack comprises a switch device, the switchpack input portion being operable to operate the switch device of the switchpack, the test apparatus switch device being operable by the test apparatus control system to cause the switchpack to provide substantially the same output as the switch pack provides when the switchpack input portion is operated.

5. An apparatus as described in paragraph 4 wherein the test apparatus switch device is connected electrically in parallel with the switchpack switch device.

6. An apparatus as described in paragraph 5 wherein the switchpack switch device is operable to make or break an electrical connection between a first set of terminals of the switchpack, the test apparatus switch device also being operable by the test apparatus control system to make or break the electrical connection between the first set of terminals of the switchpack in a corresponding manner.

7. An apparatus as described in paragraph 4 wherein the switchpack switch device comprises a mechanically actuable switch device.

8. An apparatus as described in paragraph 1 wherein the test apparatus switch device comprises one selected from amongst a mechanical switch and an electronic switch.

9. An apparatus as described in paragraph 1 wherein the test apparatus switch device comprises a mechanical actuator for actuating the switchpack input portion.

10. An apparatus as described in paragraph 1 wherein the switchpack comprises a touch-sensitive display device.

11. An apparatus as described in paragraph 1 wherein the switchpack comprises a remote control device such as a keyfob device.

12. An apparatus as described in paragraph 1 wherein the test apparatus control system is operable to read signals transmitted on a motor vehicle controller area network.

13. An apparatus as described in paragraph 1 wherein the test apparatus control system is operable to transmit signals on a motor vehicle controller area network.

14. An apparatus as described in paragraph 1 comprising a test apparatus removable overload protection element connectable to an electrical connector of a vehicle electrical circuit overload protection apparatus, the test apparatus removable overload protection element being operable to detect a flow of electrical current therethrough, the element being operable to output a signal to the test apparatus control system corresponding to an amount of electrical current flow therethrough.

15. An apparatus as described in paragraph 14 wherein the test apparatus removable overload protection element is operable to limit an amount of electrical current flowing through an electrical circuit of the motor vehicle.

16. A motor vehicle comprising apparatus according to paragraph 1.

17. A kit of parts comprising: motor vehicle test apparatus, the test apparatus comprising: a test apparatus control system comprising a computing device; a test apparatus switch device operable under the control of the test apparatus control system to control at least one motor vehicle switchpack to provide a switchpack control output to the vehicle control system, the switchpack also being operable to provide the switchpack control output when an input portion of the switchpack is operated, the test apparatus control system being operable to monitor a response by the vehicle control system to the switchpack control output.

18. A kit of parts as described in paragraph 17 further comprising at least one motor vehicle switchpack.

19. A kit of parts as described in paragraph 17 comprising a current measurement element, the current measurement element being adapted to replace a removable overload protection element of a vehicle electrical circuit overload protection apparatus.

20. A method of monitoring operation of a motor vehicle comprising at least one switchpack, the switchpack comprising an input portion operable to control the switchpack to provide a switchpack control output to a vehicle control system, the method comprising: providing a test apparatus control system having a computing device, and controlling a test apparatus switch device by means of the test apparatus control system to cause the at least one switchpack to provide the switchpack control output to the vehicle control system; and monitoring by means of the test apparatus a response by the vehicle control system to the switchpack control output.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention claimed is:

1. An apparatus comprising:
at least one motor vehicle switchpack, the switchpack comprising a user-actuable input operable to control the switchpack to provide a switchpack control output to a motor vehicle control system; and
a motor vehicle test apparatus, the test apparatus comprising:
a test apparatus control system comprising a computing device; and
a test apparatus switch operable under the control of the test apparatus control system to control the at least one switchpack to provide the switchpack control output to the vehicle control system, the test apparatus control system being operable to monitor a response by the vehicle control system to the switchpack control output;
wherein the test apparatus switch comprises a test apparatus switch device and the switchpack comprises a switchpack switch device, wherein the test apparatus switch device is connected electrically in parallel with the switchpack switch device, the user-actuable input configured to operate the switchpack switch device of the switchpack, the test apparatus switch device being operable by the test apparatus control system to control the switchpack to provide substantially the same switchpack control output as the switchpack provides when the user-actuable input is operated.

2. The apparatus of claim 1, wherein the test apparatus control system is operable to perform at least one action in dependence on the response of the vehicle control system to the switchpack control output.

3. The apparatus of claim 1, wherein the test apparatus control system computing device is operable to run computer program code, the test apparatus control system being operable to control the test apparatus switch to control the at least one switchpack to provide the switchpack control output under the control of the computer program code.

4. The apparatus of claim 1, wherein the switchpack switch device is operable to make or break an electrical connection between a first set of terminals of the switchpack, the test apparatus switch device also being operable by the test apparatus control system to make or break the electrical connection between the first set of terminals of the switchpack in a corresponding manner.

5. The apparatus of claim 1, wherein the switchpack switch device comprises a mechanically actuable switch.

6. The apparatus of claim 1, wherein the test apparatus switch comprises one selected from amongst mechanical switches and electronic switches.

7. The apparatus of claim 1, wherein the switchpack comprises a touch-sensitive display.

8. The apparatus of claim 1, wherein the switchpack comprises a remote control device.

9. The apparatus of claim 1, wherein the test apparatus control system is operable to read signals transmitted on a motor vehicle controller area network.

10. The apparatus of claim 1, wherein the test apparatus control system is operable to transmit signals on a motor vehicle controller area network.

11. The apparatus of claim 1, comprising a test apparatus removable overload protection element connectable to an electrical connector of a vehicle electrical circuit overload protection apparatus, the test apparatus removable overload protection element configured to detect a flow of electrical current therethrough and configured to output a signal to the test apparatus control system corresponding to an amount of electrical current flow therethrough.

12. The apparatus of claim 11, wherein the test apparatus removable overload protection element is operable to limit an amount of electrical current flowing through an electrical circuit of the motor vehicle.

13. A motor vehicle comprising the apparatus of claim 1.

14. A method of monitoring operation of a motor vehicle comprising at least one switchpack, the switchpack comprising a user-actuable input operable by a user to control a switchpack switch device to cause the switchpack to provide a switchpack control output to a motor vehicle control system, the method comprising:

controlling a test apparatus switch device of a test apparatus switch via a test apparatus control system to control the at least one switchpack to provide substantially the same switchpack control output to the vehicle control system as provided by the user-actuable input, wherein the test apparatus switch device is connected electrically in parallel with the switchpack switch device; and monitoring, via the test apparatus, a response by the vehicle control system to the switchpack control output.

* * * * *